United States Patent
Bordes et al.

(10) Patent No.: US 11,605,962 B2
(45) Date of Patent: Mar. 14, 2023

(54) MULTI-LEVEL ENCODING FOR BATTERY MANAGEMENT SYSTEM

(71) Applicant: NXP USA, Inc., Austin, TX (US)

(72) Inventors: Laurent Bordes, Aucamville (FR); Simon Bertrand, Ramonville Saint Agne (FR); Alexis Nathanael Huot-Marchand, Labastidette (FR)

(73) Assignee: NXP USA, Inc., Austin, TX (US)

( * ) Notice: Subject to any disclaimer, the term of this patent is extended or adjusted under 35 U.S.C. 154(b) by 316 days.

(21) Appl. No.: 16/934,458

(22) Filed: Jul. 21, 2020

(65) Prior Publication Data
US 2021/0050736 A1    Feb. 18, 2021

(30) Foreign Application Priority Data
Aug. 14, 2019   (EP) .................................... 19306014

(51) Int. Cl.
*H02J 7/00*    (2006.01)
*H01M 10/42*   (2006.01)
*H04L 67/12*   (2022.01)

(52) U.S. Cl.
CPC ......... *H02J 7/0047* (2013.01); *H01M 10/425* (2013.01); *H02J 7/007* (2013.01); *H04L 67/12* (2013.01); *H01M 2010/4271* (2013.01)

(58) Field of Classification Search
None
See application file for complete search history.

(56) References Cited

U.S. PATENT DOCUMENTS

| | | |
|---|---|---|
| 5,525,983 A | 6/1996 | Patel et al. |
| 5,818,362 A | 10/1998 | Walker |

(Continued)

FOREIGN PATENT DOCUMENTS

EP     2518957 A1    6/2012

OTHER PUBLICATIONS

U.S. Appl. No. 16/934,403, filed Jul. 21, 2020, 30 pages.
(Continued)

*Primary Examiner* — Roy Y Yi

(57) ABSTRACT

A battery management system comprises a first and second battery cell controllers and a transmission line providing a point-to-point signal transmission path between the first and second battery cell controllers. At least one of the first and second battery cell controllers includes a logic circuit constructed and arranged for encoding data for transmission as a serial data stream along the signal transmission path in compliance with a multi-level encoding technique. The logic circuit comprises an encoding/decoding circuit that generates a modulated signal of the serial data stream over at least three discrete signal levels at a predetermined and fixed data pulse frequency for transmission through the transmission line and encodes a plurality of data units of the serial data stream into a data packet. The data packet includes at least three symbols constructed and arranged with at least four consecutive transmissions per symbol. Each transmission of each symbol assumes one of the three discrete signal levels. At least one transceiver is configured in a transmit mode or a receive mode and that discards any combinations of the maximum number of possible combinations to reduce a source of electromagnetic interference (EMI) on the transmission line.

18 Claims, 6 Drawing Sheets

(56) References Cited

U.S. PATENT DOCUMENTS

| | | | |
|---|---|---|---|
| 7,093,145 B2* | 8/2006 | Werner | H04L 25/4917 |
| | | | 327/108 |
| 8,908,779 B2 | 12/2014 | Douglass | |
| 10,206,081 B1 | 2/2019 | Hall et al. | |
| 10,423,567 B2 | 9/2019 | Khan et al. | |
| 10,785,065 B2 | 9/2020 | Shuvalov | |
| 11,105,860 B2 | 8/2021 | Takeshita | |
| 2006/0075170 A1 | 4/2006 | Behrendt et al. | |
| 2011/0280322 A1 | 11/2011 | Suenaga et al. | |
| 2013/0019037 A1 | 1/2013 | Flippin et al. | |
| 2013/0264881 A1 | 10/2013 | Roeper et al. | |
| 2014/0129164 A1 | 5/2014 | Gorbold | |
| 2014/0306657 A1 | 10/2014 | Lundgren et al. | |
| 2015/0063494 A1 | 3/2015 | Simpson et al. | |
| 2017/0010329 A1 | 1/2017 | Tang et al. | |
| 2021/0109161 A1 | 4/2021 | Huot-Marchand et al. | |

OTHER PUBLICATIONS

Denso-Freescale-TRW, "DSI3 Bus Standard," Revision 1.00, Feb. 16, 2011, 45 pages.

NXP Semiconductors, "PB_MC33771C, Battery cell controller IC, Product brief," Rev. 1.0, Jan. 20, 2020, Downloaded Jun. 1, 2020 from https://www.nxp.com/docs/en/product-brief/PB_MC33771C.pdf, 30 pages.

Botha, Louis, "Multilevel Sequences and Line Codes," Master of Engineering Thesis, University of Johannesburg, May 1, 1991, downloaded from https://core.ac.uk/download/pdf/54201146.pdf Jun. 1, 2020, 166 pages.

Notice of Allowance for U.S. Appl. No. 16/934,403, filed Sep. 13, 2022, 17 pages.

* cited by examiner

| Encoded Data | | Symbol Transmitted | | | |
|---|---|---|---|---|---|
| Binary | Hexad. | 1st Chip | 2nd Chip | 3rd Chip | 4th Chip |
| 00000 | 00 | -1 | -1 | -1 | 0 |
| 00001 | 01 | -1 | -1 | -1 | 0 |
| 00010 | 02 | -1 | -1 | -1 | 1 |
| 00011 | 03 | -1 | -1 | 0 | 0 |
| 00100 | 04 | -1 | -1 | 0 | -1 |
| 00101 | 05 | -1 | -1 | 0 | 0 |
| 00110 | 06 | -1 | -1 | 0 | 1 |
| 00111 | 07 | -1 | 0 | -1 | 0 |
| 01000 | 08 | 0 | 0 | -1 | -1 |
| 01001 | 09 | 0 | 0 | -1 | 0 |
| 01010 | 0A | 0 | 0 | -1 | 1 |
| 01011 | 0B | 0 | 0 | 0 | 0 |
| 01100 | 0C | 0 | 0 | 0 | -1 |
| 01101 | 0D | 0 | 0 | 0 | 0 |
| 01110 | 0E | 0 | 0 | 0 | 1 |
| 01111 | 0F | 0 | 0 | 0 | 0 |
| 10000 | 10 | 0 | 0 | 1 | -1 |
| 10001 | 11 | 0 | 0 | 1 | 0 |
| 00001 | 11 | 0 | 0 | 1 | 1 |
| 10010 | 12 | 0 | 1 | 1 | 0 |
| 10011 | 13 | 0 | 1 | 0 | -1 |
| 10100 | 14 | 0 | 1 | 0 | 0 |
| 10101 | 15 | 0 | 1 | 0 | 1 |
| 10110 | 16 | 1 | 1 | 0 | 0 |
| 10111 | 17 | 1 | 1 | 0 | -1 |
| 11000 | 18 | 1 | 1 | 0 | 0 |
| 11001 | 19 | 1 | 1 | 0 | 1 |
| 11010 | 1A | 1 | 1 | 1 | 0 |
| 11011 | 1B | 1 | 1 | 1 | -1 |
| 11100 | 1C | 1 | 1 | 1 | 0 |
| 11101 | 1D | 1 | 1 | 1 | 1 |
| 11110 | 1E | 1 | 1 | 1 | 0 |
| 11111 | 1F | 1 | 1 | 1 | 0 |

FIG. 6 — 500

MULTI-LEVEL ENCODING FOR BATTERY MANAGEMENT SYSTEM

FIELD

The present disclosure relates generally to electric vehicle battery management systems, and more specifically, to encoding and decoding techniques for a physical layer of a data transmission of a battery management system to which a communication protocol can be applied.

BACKGROUND

In battery management system applications, electronic systems are developed to monitor an arrangement of lithium battery cells or the like, which store and output the energy required by various electronic devices of the vehicle, also referred to as automotive electronic control units, to operate an electric vehicle, for example, by controlling the charging and discharging functions of the battery cells. A battery management system typically includes one or more battery cell controllers mounted in series, each constructed and arranged for controlling several battery cells. The battery cell controllers communicate with a micro controller unit (MCU) that provides the intelligence of the system to control and monitors a state of the battery cells, for example, a battery health status, and can prevent the attempted operation of defective battery cells.

The growing volume of data required to be transferred between the different automotive electronic control units of a vehicle requires reliable and high-speed data transmissions between the battery cell controllers managing the battery cells. Also, the conductive wiring between battery cells and various vehicle systems can be susceptible to electromagnetic interference (EMI) or related radio frequency energy, which can reduce the accuracy of performance measurements collected by the battery management system.

SUMMARY

Aspects of the disclosure are defined in the accompanying claims.

In a first aspect, there is provided a battery management system, comprising: a first battery cell controller; a second battery cell controller, the first battery cell controller and the second battery cell controller each monitoring a plurality of battery cells; and a transmission line providing a point-to-point signal transmission path between the first battery cell controller and the second battery cell controller, wherein at least one of the first battery cell controller or the second battery cell controller includes: a logic circuit constructed and arranged for encoding data for transmission as a serial data stream along the signal transmission path in compliance with a multi-level encoding technique, the logic circuit comprising: an encoding/decoding circuit that generates a modulated signal of the serial data stream over at least three discrete signal levels at a predetermined and fixed data pulse frequency for transmission through the transmission line and encodes a plurality of data units of the serial data stream into a data packet, the data packet including at least three symbols constructed and arranged with at least four consecutive transmissions per symbol, each transmission of each of the at least three symbols assuming one of the at least three discrete signal levels; and at least one transceiver configured in a transmit mode or a receive mode and that discards any combinations of the maximum number of possible combinations to reduce a source of electromagnetic interference (EMI) on the transmission line.

In one or more embodiments, the battery management system may further comprise: a micro controller unit that outputs the data to the logic circuit and manages the serial data stream including generating and outputting commands to the first or second battery cell controller to control transitions between the at least three discrete signal levels and the discarding of the any combinations of the maximum number of possible combinations of the at least three discrete signal levels; and a driver circuit between the micro controller unit and the transmission line that converts a serial peripheral interface output from the micro controller unit to pulse bit data for output to the transmission line.

In one or more embodiments, the driver circuit may comprise: a first-in first-out (FIFO) memory that reads a predetermined number of sequential bits of the serial data stream received from the MCU and translates them to a multi-bit word; an encoder/decoder circuit that translates the multi-bit word into a multi-level pulse encoded symbol comprising the at least four consecutive transmissions; and a transceiver comprising an analog interface, wherein the encoder/decoder circuit outputs a binary level corresponding to the symbol transmissions on the analog interface, and wherein the analog interface of the transceiver converts high and low logic inputs of the analog interface to a differential voltage so that a resulting generated current is output to the transmission line according to the at least three discrete signal levels.

In one or more embodiments, the differential voltage may be a positive differential voltage, negative differential voltage, or a null voltage on a plurality of analog outputs of the analog interface of the transceiver, and the differential analog voltage may be provided by activating or disactivating at least one of a pull-up or pull-down electrical circuit on each analog output.

In one or more embodiments, the transmission line may be a galvanically isolated transmission line that includes a capacitive isolation circuit.

In one or more embodiments, the encoding/decoding circuit may include a memory that stores a data encoding table that maps a set of possible combinations of the at least three discrete signal levels to the encoded data bits.

In one or more embodiments, the logic circuit may reserve a subset of the plurality of logic bits for a direct current (DC) balance line code processing operation.

In one or more embodiments, the at least one transceiver may discard combinations of the any combinations of the maximum number of possible combinations including removing all combinations with the same levels on the four consecutive transmissions and removing all combinations that do not include at least a 0 value signal level in the four consecutive transmissions.

In one or more embodiments, the data stream may include a plurality of data nibbles that are encoded into the at least three symbols, and each symbol encodes information of the five bit word in two periods so that the data packet includes at least fifteen bits.

In one or more embodiments, at least one of the first battery cell controller or the second battery cell controller may monitor the plurality of battery cells including one or more of performing synchronous battery voltage/current measurement, coulomb counting, cell temperature measurement and integrated cell balancing, validation of the measurement integrity, sensing the physical quantities of a lithium-ion battery, and monitoring battery functions to validate the integrity of cell measurements.

In a second aspect, there is provided a semiconductor device for encoding data bits onto a transmission line capable of reducing or eliminating undesired emission of radio frequency energy, comprising: a bidirectional transceiver; and a logic circuit constructed and arranged to encode data for output from the bidirectional transceiver as a serial data stream along the signal transmission path that is modulated over at least three discrete signal levels at a predetermined and fixed data pulse frequency, the logic circuit encoding a plurality of data nibbles of the serial data stream into a data packet, the data packet including at least three symbols constructed and arranged with at least four consecutive transmissions per symbol, each transmission assuming one of the three discrete signal levels; wherein the at least three symbols are encoded into a subset of a maximum number of possible combinations of the at least three discrete signal levels, and wherein the bidirectional transceiver discards combinations of the maximum number of possible combinations that reduce the undesired emission of radio frequency energy with respect to the symbols when output to the transmission line.

In one or more embodiments, the logic circuit may encode logic bits correspond to transitions between voltage levels of the at least three discrete signal levels.

In one or more embodiments, the semiconductor device may further comprise a data encoding table that maps the possible combinations of the of the at least three discrete signal levels to the encoded data bits.

In one or more embodiments, each of the at least three symbols may be transmitted via four consecutive transmissions and encode the information of a five bit word in two periods of the fixed data pulse frequency.

In one or more embodiments, the logic circuit may reserve a subset of the plurality of logic bits for a direct current (DC) balance line code processing operation.

In a third aspect, there is provided a method for encoding data bits onto a transmission line between a first battery cell controller and a second battery cell controller, comprising: configuring a circuit for three discrete signal levels; generating a plurality of data nibbles from the three discrete signal levels; encoding the data nibbles into three symbols, each symbol formed of four consecutive chips, each chip assuming one of the three discrete signal levels; encoding each symbol on two periods of a fixed data pulse frequency; and discarding any of a maximum number of possible combinations of the at least three discrete signal levels that reduce or eliminate a source of electromagnetic interference (EMI) on the transmission line.

In one or more embodiments, discarding any of a maximum number of possible combinations of the at least three discrete signal levels may comprise one or more of: discarding combinations having signal levels that impose a current consumption when a transmit driver coupled to the transmission line is active and the current consumption is higher than a threshold value.

In one or more embodiments, the method may further comprise reserving a plurality of logic bits for a direct current (DC) balance line code processing operation.

In one or more embodiments, the method may further comprise: forming a data packet including the three symbols arranged to form a five bit word in two periods of a fixed data pulse frequency; and encoding by each symbol information of the five bit word in two periods so that the data packet includes at least fifteen bits.

In one or more embodiments, the method may further comprise: monitoring, by a micro controller unit, a plurality of battery cells controlled by the first or second battery cell controller, including managing the serial data stream including generating and outputting commands to the first or second battery cell controller to control transitions between the signal levels and the discarding of the any combinations of the maximum number of possible combinations of the at least three discrete signal levels; and converting, by a driver circuit between the micro controller unit and the transmission line a serial peripheral interface output from the micro controller unit to pulse bit data for output to the transmission line.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 6 is a data encoding table, in accordance with an example embodiment of the present disclosure.

DETAILED DESCRIPTION

In brief overview, embodiments of the present inventive concepts include a multi-level data encoding technique for a communication protocol used in a battery management system for exchanging data between a physical layer interface of an upstream battery cell controller of the system and a physical layer interface of a downstream battery cell controller and/or between physical layer interfaces of a battery cell controller and a microcontroller unit (MCU). Features of the inventive concepts provide for an increased data communication speed as compared to conventional battery management systems, especially with respect to accommodating for the growing demand of data exchanged between electronic components of electric and hybrid vehicles. In some embodiments, the innovative multi-level data encoding technique does not require modifications to either the communication physical layer analog circuitry to which it is applied or the fixed frequency used for the data pulses. In addition, the inventive data encoding technique when applied to a capacitive isolation circuit of a point-to-point differential transmission line reduces the effects of EMI on the transmission line between the battery cell controllers and MCU of the battery management system, at least in part by discarding signal value combinations stored at a data encoding table of the system, which otherwise have a high impact on the EMI.

Figure 1:
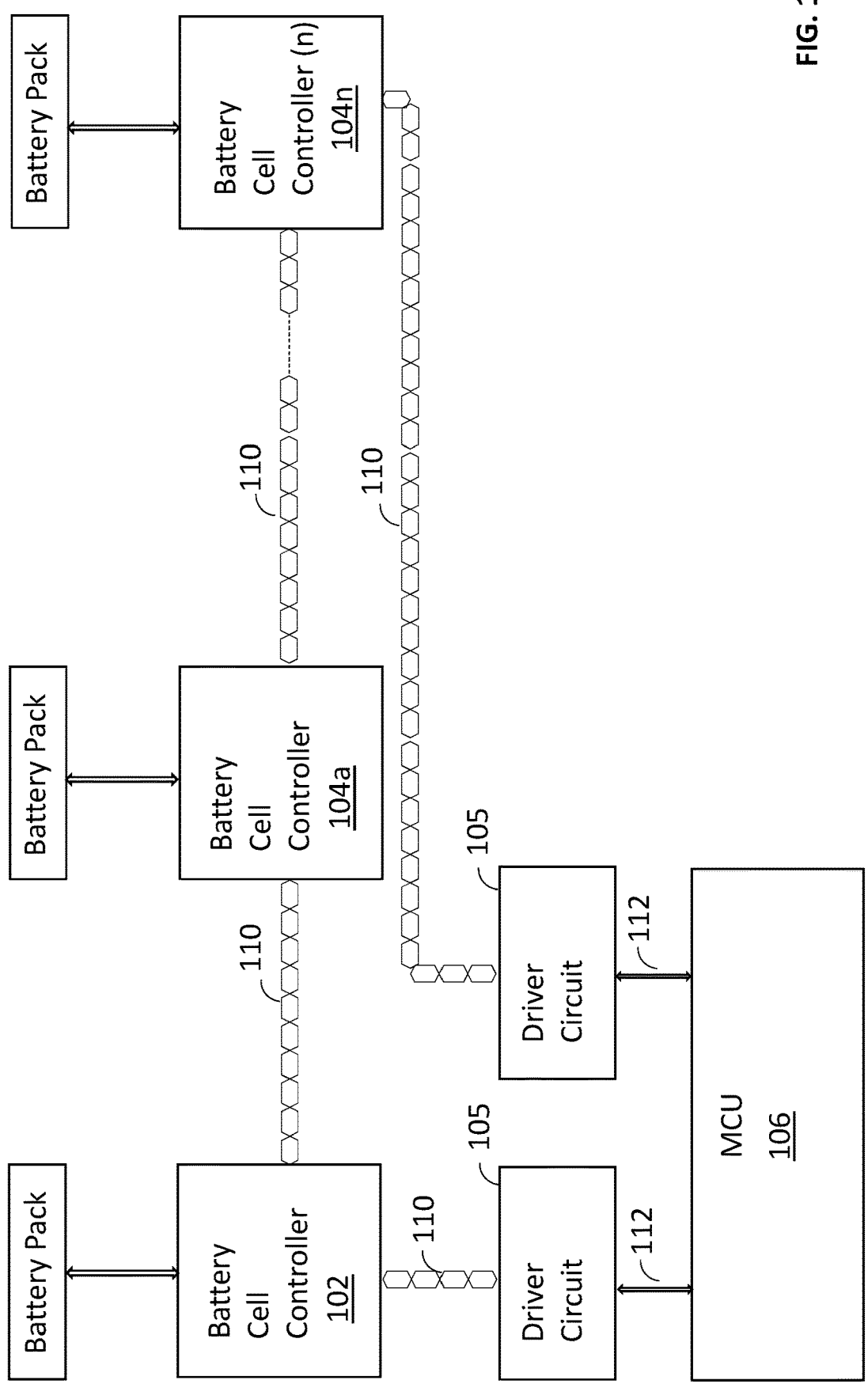
FIG. 1 is a block diagram of a battery management system, in accordance with an example embodiment of the present disclosure.

FIG. 1 is a schematic diagram illustrating in which embodiments of the present inventive concepts can be practiced.

As shown in FIG. 1, a battery management system includes a first battery cell controller 102, a second battery cell controller 104, and a microcontroller unit (MCU) 106, which provides the intelligence of the system, for example, managing and controlling the plurality of battery cell controllers. Although two battery cell controllers 102, 104 are shown, a battery management system in accordance with some embodiments includes more than two battery cell controllers configured to communicate with each other serially, i.e., also connected to one or more battery cell controllers 104n, where n is an integer greater than 1, in a daisy chain configuration. The battery management system is not limited to those elements described in FIG. 1, and can include elements, features, and functions other than those illustrated in FIG. 1.

The battery management system is constructed and arranged to perform synchronous battery voltage/current measurement, coulomb counting, cell temperature measurement and integrated cell balancing, validation of the measurement integrity, and/or other functions related to automotive battery monitoring and maximizing the life of a vehicle battery, for example, sensing the physical quantities of a lithium-ion battery, monitoring battery functions to validate the integrity of cell measurements, and so on. Each of the first battery cell controller 102 and a second battery cell controller(s) 104 can monitor a battery pack comprising a plurality of battery cells, for example, ranging from 6-18 cells but not limited thereto. In doing so, data communications are established between the first battery cell controller 102, second battery cell controller 104(s), and MCU 106. A galvanically isolated transmission line, or bus 110, may extend between the first battery cell controller 102 and the second battery cell controller 104, and/or between at least one of the battery cell controllers 102, 104 and the MCU 106 to provide a point-to-point differential communication. In some embodiments, the first battery cell controller 102 is collocated with one or more second battery controllers 104(n) are co-located in a same module, circuit board, housing, and so on. In some embodiments, at least one of the battery cell controllers 102, 104 and the MCU 106 are co-located in a same module, circuit board, housing, and so on.

In some embodiments, the battery management system includes a driver circuit 105 between the MCU 106 and a battery cell controller 102 of a daisy-chain configuration of two more battery cell controllers. As shown in FIG. 1, a first driver circuit 105 is between the MCU 106 and the first battery cell controller 102 and a second driver circuit 105 is between a last battery cell controller 104n is the daisy-chain of multiple controllers to form a loop between the battery cell controllers 102, 104a-n and the MCU 106. The driver circuit 105 is constructed and arranged to receive data from the MCU 106 via a serial peripheral interface (SPI) 112 and convert the data to be output to the capacitive isolation circuits 204 of a galvanically isolated transmission line 110 between the driver circuit 105 and the battery cell controller 102.

Figure 3:
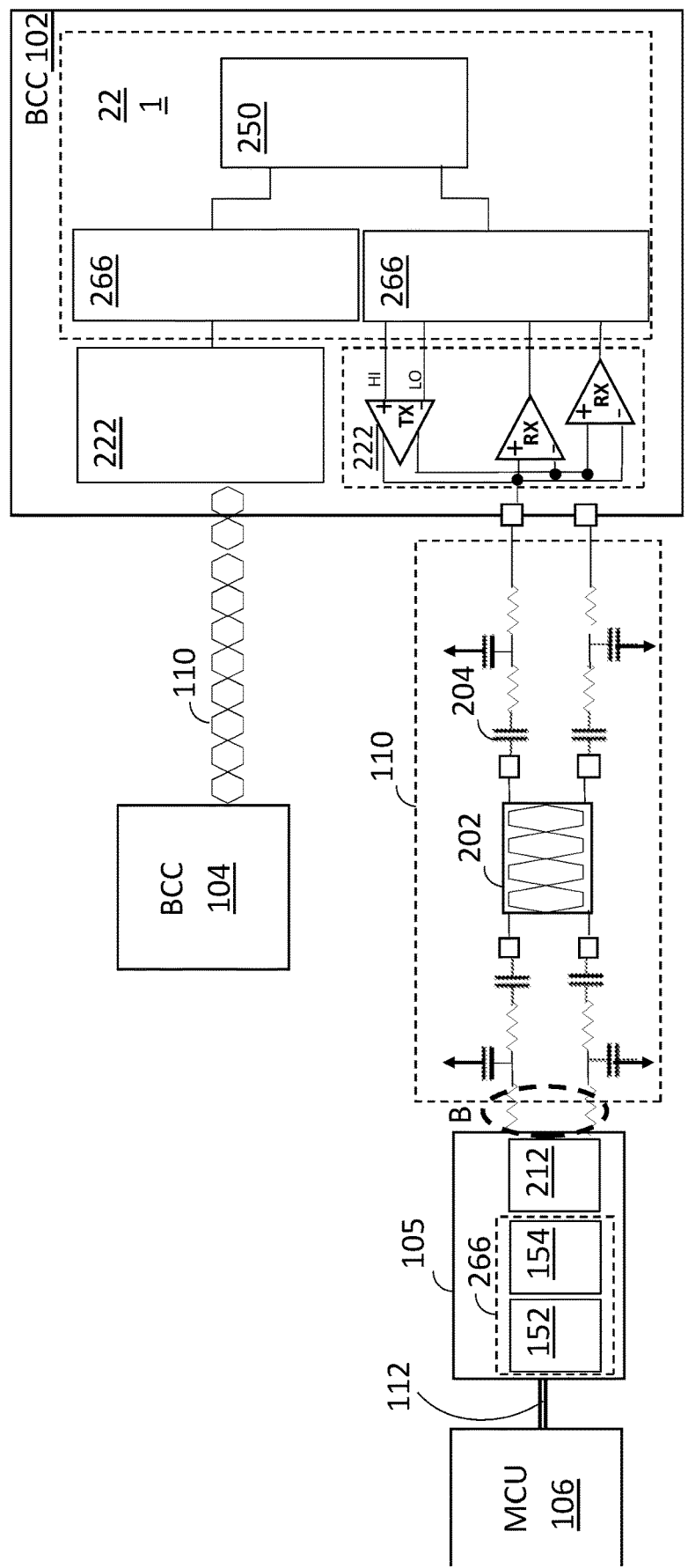
FIG. 3 is a schematic diagram of a physical layer interface between the microcontroller unit and two battery cell controllers of the battery management system of FIG. 1.

As shown in FIG. 3 (described below), in some embodiments, the driver circuit 105 comprises a first-in first-out (FIFO) memory 152, an encoder/decoder circuit 154, and a bi-directional transceiver 212. The transceiver 212 of the driver circuit 105 is similar to or the same as bidirectional transceivers 212, 222 of the battery cell controllers 102, 104 a-n (generally, 104), for example, including a related analog interface that collectively exchange signals between the serial peripheral interface 112 of the MCU 106 and a transformer physical layer of the transmission line 110, for example, performing physical layer conversion functions. The FIFO memory 152 and encoder/decoder circuit 154 can also be part of an encoding/decoding circuit 266 included in the battery cell controllers 102, 104.

In an example operation of the battery management system, a plurality of bits, e.g., 1, 0, 0, 1, 1, is sequentially output from the MCU 106 to the driver circuit 105 via the serial peripheral interface 112. As previously described, the driver circuit 105 includes a physical layer transceiver 212 that is constructed and arranged to interface a microcontroller such the MCU 106 to a high speed isolated communication network that includes the transmission line 110. In doing so, the data bits are directly converted by the driver circuit 105 to pulse bit information and transferred to the transmission line 110. In this example, the FIFO memory 152 reads the five sequential bits received from the MCU 106 and translates them to a five-bit word (10011). The encoder/decoder circuit 154 translates the five-bit word (10011) into a multi-level pulse encoded symbol comprising four consecutive transmissions, or chips (e.g., 0, 1, 0, −1). In some embodiments, the encoder/decoder circuit 154 stores and/or otherwise processes data of the encoder/decoder table 500 shown in FIG. 6. The encoder/decoder circuit 154 in response outputs a binary level corresponding to the symbol transmissions on the high and low inputs of the analog interface of the transceiver 212, and therefore converts the high and low logic inputs to either a positive differential voltage, a negative differential voltage, or a null voltage on the analog differential outputs of the transceiver 212. The differential analog voltage is provided by activating or deactivating various pull-up and/or pull-down electrical circuits on each analog output. Since pull-up and pull-down paths are formed, a generated current can flow through the transmission line 110 into a bus termination resistance. For example, the various signal levels can change the differential voltage at input region A in FIG. 2 or input region B in FIG. 3 to permit for such current flow, which of which includes a combination of pull-up and/or pull-down electrical circuits for outputting a current accordingly.

Figure 2:
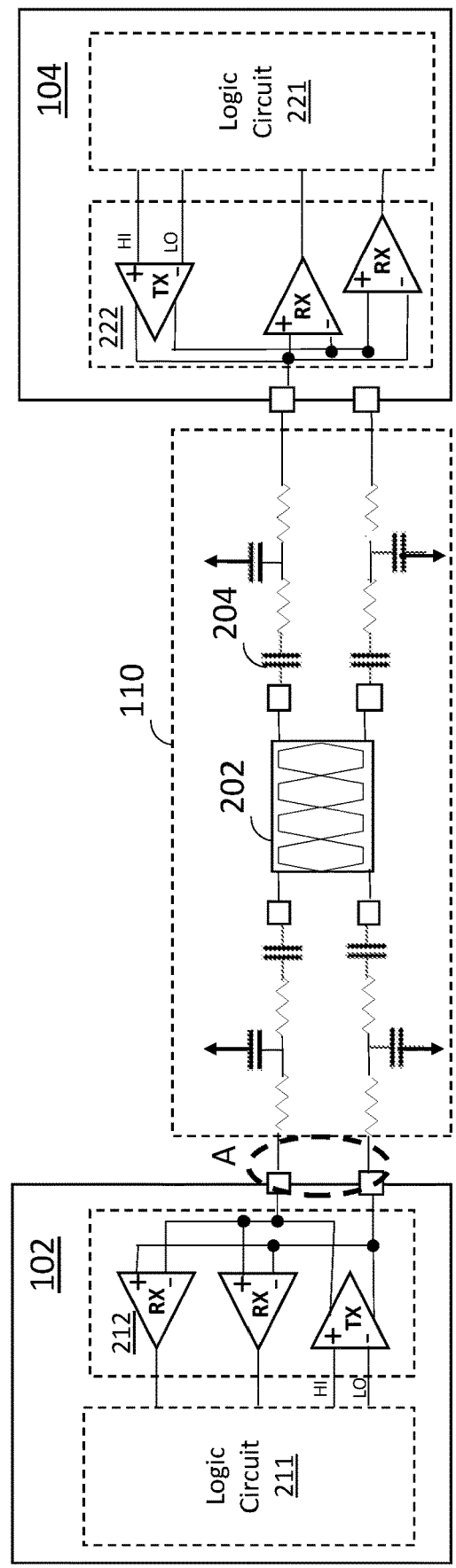
FIG. 2 is a schematic diagram of a physical layer interface between two battery cell controllers including a capacitive isolation bus communication for the battery management system of FIG. 1.

Although the foregoing example refers to a data exchange between the MCU 106 and a battery cell controller 102 via a driver circuit 105, a similar data exchange can occur between two battery cell controllers 102, 104 via the transmission bus 110. As shown in FIGS. 2 and 3, high speed point-to-point differential isolated communications can be achieved using a capacitive isolation circuit that includes transceivers 212, 222 of a bus driver of the first and second battery cell controllers 102, 104, respectively. In particular, one transceiver 212 may be configured in a transmit mode and another transceiver 222 may be configured in a receive mode so that downstream and upstream communication can be performed and to ensure transmission of an unattenuated message to the next battery cell controller through the daisy chain by reducing or preventing voltage transients or the like. In centralized battery monitoring systems, the battery cell controllers 102 and 104 are connected via a capacitive isolation system. In distributed battery monitoring systems where the battery cell controllers 102 and 104 are not collocated in a vehicle or the like, i.e., the battery cell controllers are at disparate locations, they may communicate with each other via the transmission line 110, which may include a twisted pair cable 202 to ensure the connectivity and pairs of coupling capacitors on each side of the twisted pair cable 202 to provide the DC isolation.

The data exchanges described and illustrated in embodiments herein comply with a communication protocol having a physical layer formed between physical interfaces of the battery cell controllers 102, 104 and the MCU 106, respectively. The communication protocol stack physical layer may include a physical signaling sublayer where encoding, transmission, decoding, and galvanically isolation functions are performed between the battery cell controllers 102, 104 and/or between a battery cell controller 102 and/or 104 and the MCU 106 so as to break up ground loops, protect the system from high-voltage transients, and reduce signal distortion.

FIG. 3 is a block diagram of a logic circuit of a battery cell controller, for example, logic circuit 211 or 221 shown in FIGS. 1 and 2. As shown in FIG. 3, in some embodiments, the logic circuit 211, 221 can each include but not be limited to a battery cell controller (BCC) logic device 250 and an encoding/decoding circuit 266. In some embodiments, the BCC logic device 250 and encoding/decoding circuit 266 may communicate with each other via a bus or transmission line similar to or the same as the serial peripheral interface 112 between the MCU 106 and driver circuit 105 shown in FIG. 1. The encoding/decoding circuit 266 can include similar or same electronic circuits and perform similar functions as the FIFO memory 152 and encoder/decoder circuit 154 of the driver circuit 105, and the transceiver 212 in a transmit mode and transceiver in a transmit mode 222 can include similar or same electronic circuits and perform similar functions as the analog interface of the transceiver 212 of the driver circuit 105. The BCC logic device 250 provides global control logic functions for the battery cell controller 102, 104 to which it is associated, such as battery cell balancing, current chain measurement, voltage cell measurement, and so on.

Figure 4:
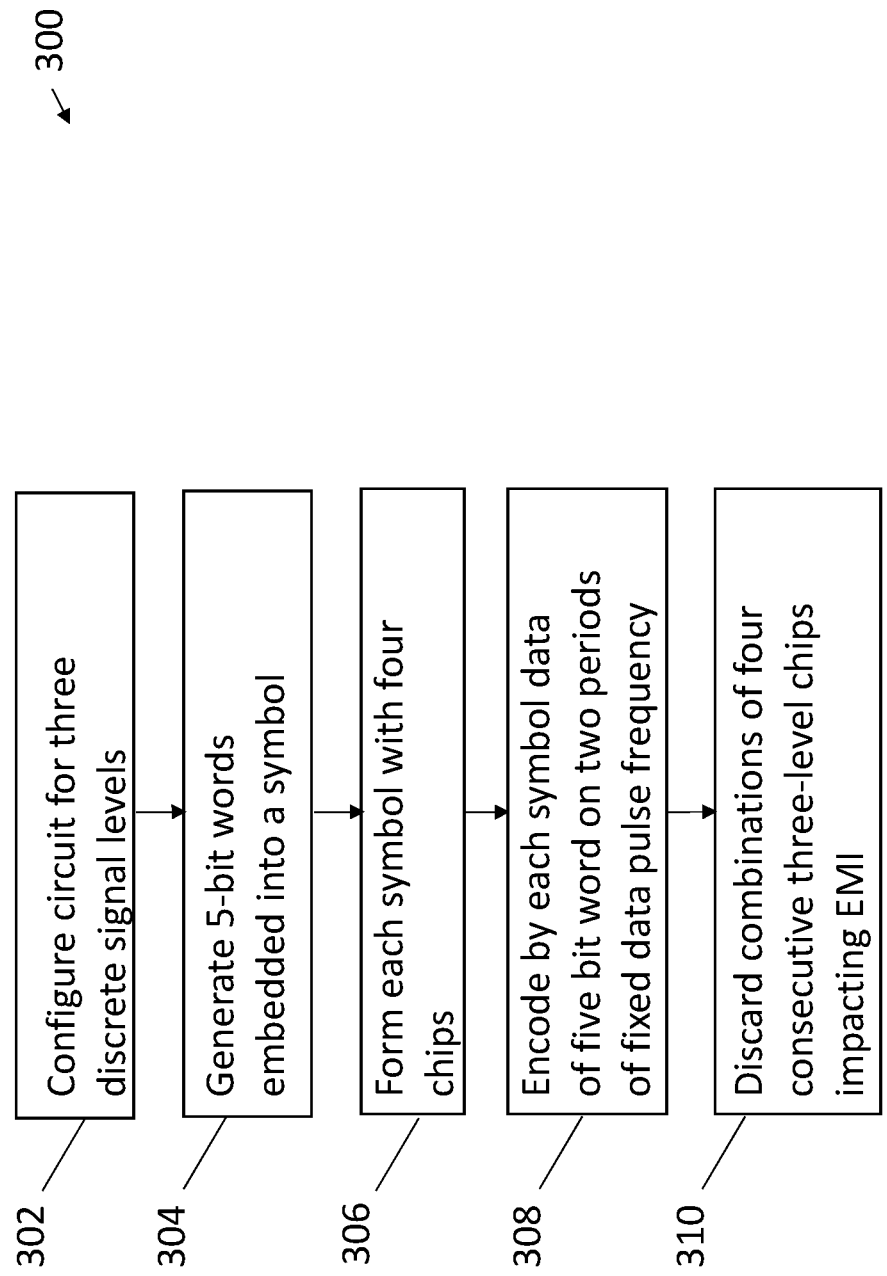
FIG. 4 is a flowchart illustrating a method for multi-level encoding for a battery management system, in accordance with an example embodiment of the present disclosure.

FIG. 4 is a flowchart illustrating a method 300 for multi-level encoding for a battery management system, in accordance with some embodiments. Some or all of the method steps of the flowchart can be generated according to multi-level encoding architecture above. In some embodiments, some or all of the method 300 is executed by a hardware circuit of one or both battery cell controllers 102, 104 and/or MCU 106.

In operation, at block 302, the battery management system, for example, shown in FIGS. 1-3, is constructed and arranged for multi-level encoding, for example, using three different signal levels (e.g., −1, 0, +1), e.g., voltage, current, or amplitude levels, to transmit and receive data, depending on the transitions between the signal levels. For example, the battery management system encodes logic (1) or (0) bits corresponding to transitions between voltage levels of the different signal levels.

In some embodiments, the battery management system includes a multi-level encoding circuit of the driver circuit 105 between the MCU 106 and a battery cell controller 102 to generate signal levels corresponding to consecutive chips providing the symbols used for arranging data for output to the isolated transmission line 110. In some embodiments, the multi-level encoding circuit is part of the battery cell controller 102, 104, and/or other battery cell At block 304, a plurality of data units such as nibbles are generated. In some embodiment, a data nibble of a data unit is a five-bit word embedded into a symbol. The data nibbles are generated from the three signal levels for encoding into symbols. For example, the encoder encodes a plurality of data nibbles of the serial data stream into a data packet or other unit of data. The serial data stream can be modulated over at least three discrete signal levels at a predetermined and fixed data pulse frequency, for example, 4.0 MHz. For example, a +1 value output from the encoder/decoder circuit 154 of the driver circuit 105 corresponds to a digital voltage level '1' on a high (HI) net and digital voltage level '0' on a low (LO) net input to the analog interface 212. A 0 value output from the encoder/decoder circuit 154 of the driver circuit 105 corresponds to a digital voltage level '0' on a high net and digital voltage level '0' on a low net input to the analog interface 212. A −1 value output from the encoder/decoder circuit 154 of the driver circuit 105 corresponds to a digital voltage level '0' on a high net and digital voltage level '1' on a low net input to the analog interface 212. Similarly, a transceiver 222 can output a digital voltage level '1' on a high net and digital voltage level '0' to the encoding/decoding circuit 266, where a +1 value is produced by the encoding/decoding circuit 266. In sum, the data nibbles are encoded into symbols according to a three-level coded approach, for example, shown in FIG. 5, where the three levels (−1, 0, 1) are provided and data nibbles are encoded into symbols. The pulse-encoded symbols are then encoded into current levels to form a set of five-bit words.

Figure 5:
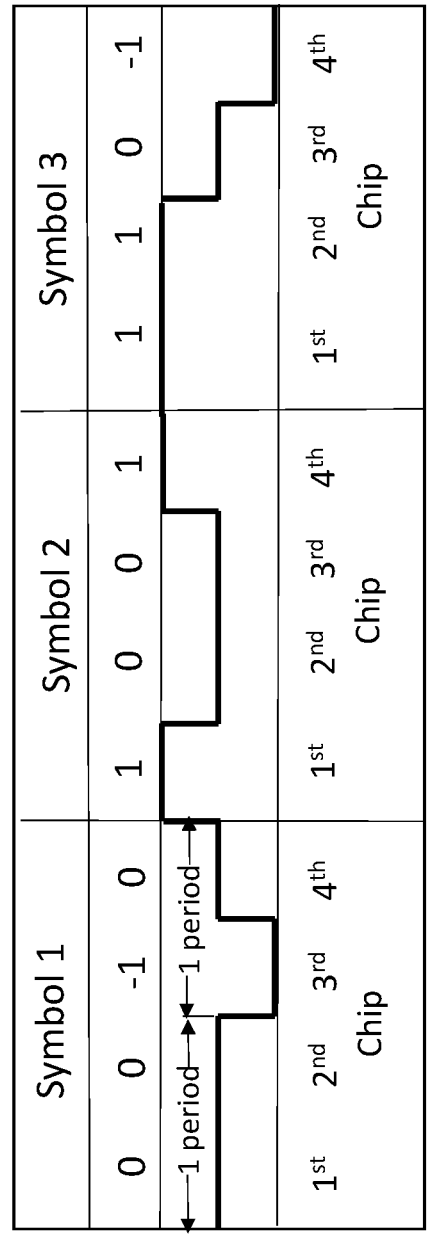
FIG. 5 is an illustrative example of a three-symbol data packet, in accordance with an example embodiment of the present disclosure.

In some embodiments, a symbol in turn comprises four consecutive transmissions, or chips. At block 306, each symbol (1-3) is produced with four consecutive transmissions, referred to as $1^{st}$ through 4th "chips" that each assumes one of the three discrete levels for signal pulses used for encoding positive, negative, and zero, respectively, as shown in FIG. 5. The data pulses are single period pulse waves that indicate a logic 1 or 0 value based on the phase.

In some embodiments, as shown in block 308, each symbol encodes the information of a 5-bit word. See for example FIG. 6, which illustrates a data encoding table 500 for five-bit words in four chips per symbol. The data encoding table 500 includes combinations of signal levels or values that are recognized, translated, or otherwise established according to a predetermined computer standard, protocol, criteria, or the like. Referring again to FIG. 5, a three symbol data packet corresponds to twelve (12) chips or fifteen (15) data bits. A predetermined communication protocol defines the number of data bits in each message that is related to the number of symbols per message. In some embodiments, each symbol transmitted via four consecutive chips encodes the information of a five-bit word in two periods of a fixed data pulse frequency. By comparison, conventional encoding techniques transmit one bit in two periods, which provide the inventive concept a data communication speed ×5 ratio improvement over such conventional encoding techniques. For example, a 4.0 MHz frequency used by a physical layer of a communication protocol may result in a 10 Mbps data communication speed (i.e., 4.0 MHz 2 periods/symbol×5 bits). Accordingly, an electrical circuit does not require hardware modifications if it is configured for a particular fixed frequency, such as 4.0 MHz, and embodiments of the data encoding technique can be applied to improve the data communication speed with no modification to the analog interface design circuitry.

As shown in block 310, and referring again to the table shown in FIG. 6, the data encoding table 500 is constructed and arranged so that the signal transitions (e.g., 1/−1) that may have a negative impact on EMI effects resulting from the signal transitions through the transmission line 110 may be discarded. In particular, eighty one (81) combinations of four consecutive three-level chips (i.e., $3^4$) are possible.

The following is a set of criteria for discarding various combinations of four consecutive multi-level chips for reducing or eliminating EMI. Although three levels are described, any multi-level chip may equally apply. In particular, five-bit words are described herein but the inventive concept is not limited thereto, and therefore, a greater number of bits may equally apply, for example, 8 bits corresponding to 8 consecutive transmissions. In some embodiments, EMI is mitigated by a combination of the twisted pair wiring of the transmission line 110 and the contribution of the removal or discarding of combinations having a high risk of EMI affecting the transmission line 110. In some embodiments, all combinations for the four consecutive 3-level chips (see FIG. 5) containing the same value (1, 0, −1) are discarded, which assures that any response packet having at least one transition in every symbol. In some embodiments, all combinations for the four consecutive 3-level chips contain at least a chip with a level 0, which assures a neutral charge difference between AC coupling capacitors of the transmission line 110, for example, differential voltage region A in FIG. 2 or voltage region B in FIG. 3. In some embodiments, all combinations for the four consecutive 3-level chips (see FIG. 5) containing a chip having a −1 level following a chip at a +1 level are discarded. In some embodiments, all combinations for the four consecutive 3-level chips (see FIG. 5) containing a chip having a +1 level following a chip at a −1 value are discarded. Such characteristics, i.e., discarding such values, allow that any response packet does not contain a transition, e.g., current consuming +1, −1 values, with an EMI effect inside each symbol.

In some embodiments, a chip of a symbol ending with a value of −1 can be followed by a symbol starting with a chip having +1 level. In some embodiments, a chip of a symbol ending with a +1 level can be followed by a symbol starting with a chip at a −1 level.

In some embodiments, a combination of consecutive symbols includes transitions between a −1 level and a +1 level and/or a +1 level and a −1 level at the transition of each symbol, which may have an effect on EMI at the pulse frequency.

In some embodiments, thirty eight (38) of the eighty one (81) combinations of four consecutive three-level chips (i.e., $3^4$) are usable after discarding combinations based on the criteria described herein. Thirty two (32) of the remaining thirty eight (38) combinations are selected by discarding remaining combinations having a maximum of symbols containing a −1 or +1 level. For example, the discarded symbols contain three "+1" or "−1" levels with one chip having a 0 value. Among the 32 combinations, some symbols contain one or two "+1" or "−1" levels. For each instance of a "+1" or "−1" level, a pulse is sent through the analog circuit and there is a current consumption in the transmit driver during a half period. A symbol with three "0" levels over four consecutive transmissions has a current consumption 50% greater than a symbol containing two "0" levels over four transmissions.

The levels of −1 or +1 have a higher cost with respect to current consumption because a transmit (TX) driver of a transceiver 212, 222 is active while the level 0 does not since the TX driver is inactive or disconnected. The remaining thirty two (32) symbols are less susceptible to EMI. In reducing the number of combinations from 81 to 32 combinations according to the foregoing criteria using a 5-bit encoding table, a communication data speed can be increased to 10 Mbps.

As previously described, the foregoing example is not limited to the criteria and values above. In another embodiment, one or more of the criteria described herein may be executed for reducing EMI effects (e.g., +1 value following a −1 value, and so on). In doing, so the number of possible combinations may be greater than 32 combinations, for example, 64 possible combinations, which may allow for an encoding table of 6-bit words instead of 5-bit words. Accordingly, a communication data speed can be increased to 12 Mbps. The reduction to 64 combinations includes two abovementioned criteria for removing 17 of the 81 combinations, namely, removing all combinations with the same levels on the four chips, and removing all combinations not containing at least a 0 level in the four chips (neutral charge between AC coupling capacitors).

As previously described, FIG. 6 illustrates a data encoding table for a five-bit word in four chips per symbol. Other embodiments may include a different data encoding table generated by the selection of different criteria than the foregoing. A message is generated of several consecutive symbols, where Y is a number of symbols and 5*Y represents the number of data bits to transmit. At the end of the consecutive symbol inside a message, some bits are reserved to perform a DC balance line code, where each message contains the same number of chips with a −1 level and a +1 level. For example, FIG. 4 contains 3 symbols of 12 chips. There are 2 "−1" levels and 4 "+1" levels. If the message to transmit is sized with 3 symbols, and 4 bits are reserved for DC balance line code in the protocol, the 4 last bits could be "−1", "−1", "0", "0" such as the number of "−1" is equal to the number of "+1" inside the entire message.

With a DC balance line executed in the complete message rather than the symbol itself, the data encoding is suitable for physical layers using capacitive isolation. The benefit of a DC balanced line executed in the complete message rather than the symbol itself is that the DC balance line executed in each symbol instead of at the end message decreases the number of possible combinations to eight combinations and encoding data with a 3-bit word corresponding to a 6 Mbps data communication speed. This is reserved for communication using transformer isolation.

As will be appreciated, embodiments as disclosed include at least the following. In one embodiment, a battery management system comprises a first battery cell controller; a second battery cell controller, the first battery cell controller and the second battery cell controller each monitoring a plurality of battery cells; and a transmission line providing a point-to-point signal transmission path between the first battery cell controller and the second battery cell controller. At least one of the first battery cell controller or the second battery cell controller includes: a logic circuit constructed and arranged for encoding data for transmission as a serial data stream along the signal transmission path in compliance with a multi-level encoding technique. The logic circuit comprises an encoding/decoding circuit that generates a modulated signal of the serial data stream over at least three discrete signal levels at a predetermined and fixed data pulse frequency for transmission through the transmission line and encodes a plurality of data units of the serial data stream into a data packet. The data packet includes at least three symbols constructed and arranged with at least four consecutive transmissions per symbol. Each chip of each of the at least three symbols assumes one of the three discrete signal levels. At least one transceiver is configured in a transmit mode or a receive mode and that discards any combinations of the maximum number of possible combinations to reduce a source of electromagnetic interference (EMI) on the transmission line.

Alternative embodiments of the battery management system include one of the following features, or any combination thereof.

In another embodiment, the battery management system further comprises a micro controller unit that monitors the battery cells, including managing the serial data stream including generating and outputting commands to the first or second battery cell controller to control transitions between the signal levels and the discarding of the any combinations of the maximum number of possible combinations of the at least three discrete signal levels; and a driver circuit between the micro controller unit and the transmission line that converts a serial peripheral interface output from the micro controller unit to pulse bit data for output to the transmission line.

In another embodiment, the driver circuit comprises a first-in first-out (FIFO) memory that reads a predetermined number of sequential bits of the serial data stream received from the MCU and translates them to a multi-bit word; an encoder/decoder circuit that translates the multi-bit word into a multi-level pulse encoded symbol comprising the at least four consecutive transmissions; and a transceiver comprising an analog interface, wherein the encoder/decoder circuit outputs a binary level corresponding to the symbol transmissions on the analog interface, and wherein the analog interface of the transceiver converts high and low logic inputs of the analog interface to a differential voltage so that a resulting generated current is output to the transmission line according to the at least three discrete signal levels.

In another embodiment, the differential voltage is a positive differential voltage, negative differential voltage, or a null voltage on a plurality of analog outputs of the analog interface of the transceiver, wherein the differential analog voltage is provided by activating or disactivating at least one of a pull-up or pull-down electrical circuit on each analog output.

In another embodiment, the transmission line is a galvanically isolated transmission line that includes a capacitive isolation circuit.

In another embodiment, the encoding/decoding circuit includes a data encoding table that maps a set of possible combinations of the at least three discrete signal levels to the encoded data bits.

In another embodiment, the logic circuit reserves a subset of the plurality of logic bits for a direct current (DC) balance line code processing operation.

In another embodiment, each of the at least three symbols is transmitted via four consecutive transmissions and encodes the information of a five bit word in two periods of the fixed data pulse frequency In another embodiment, the modulated data stream includes a plurality of data nibbles that are encoded into the at least three symbols, and each symbol encodes information of the five bit word in two periods so that the data packet includes at least fifteen bits.

In another embodiment, at least one of the first battery cell controller or the second battery cell controller monitors the plurality of battery cells including one or more of performing synchronous battery voltage/current measurement, coulomb counting, cell temperature measurement and integrated cell balancing, validation of the measurement integrity, sensing the physical quantities of a lithium-ion battery, and monitoring battery functions to validate the integrity of cell measurements.

In another embodiment, a semiconductor device for encoding data bits onto a transmission line capable of reducing or eliminating undesired emission of radio frequency energy, comprises a bidirectional transceiver and a logic circuit constructed and arranged to encode data for output from the bidirectional transceiver as a serial data stream along the signal transmission path that is modulated over at least three discrete signal levels at a predetermined and fixed data pulse frequency, the logic circuit encoding a plurality of data nibbles of the serial data stream into a data packet, the data packet including at least three symbols constructed and arranged with at least four consecutive transmissions per symbol, each transmission assuming one of the three discrete signal levels; wherein the at least three symbols are encoded into a subset of a maximum number of possible combinations of the at least three discrete signal levels, and wherein the bidirectional transceiver discards combinations of the maximum number of possible combinations that reduce a susceptibility of the undesired emission of radio frequency energy with respect to the symbols when output to the transmission line.

In another embodiment, the logic circuit encodes logic bits correspond to transitions between voltage levels of the at least three discrete signal levels.

In another embodiment, the semiconductor device further comprises a data encoding table that maps the possible combinations of the of the at least three discrete signal levels to the encoded data bits.

In another embodiment, each of the at least three symbols is transmitted via four consecutive transmissions and encode the information of a five bit word in two periods of the fixed data pulse frequency.

In another embodiment, the logic circuit (211, 221) reserves a subset of the plurality of logic bits for a direct current (DC) balance line code processing operation.

In another embodiment, a method for encoding data bits onto a transmission line between a first battery cell controller and a second battery cell controller, comprising: configuring a circuit for three discrete signal levels; generating a plurality of data nibbles from the three discrete signal levels; encoding the data nibbles into three symbols, each symbol formed of four consecutive chips, each chip assuming one of the three discrete signal levels; encoding each symbol on two periods of a fixed data pulse frequency; and discarding any of a maximum number of possible combinations of the at least three discrete signal levels that reduce or eliminate a source of electromagnetic interference (EMI) on the transmission line.

In some embodiments, discarding any of a maximum number of possible combinations of the at least three discrete signal levels comprises one or more of: discarding combinations having signal levels that impose a current consumption when a transmit driver coupled to the transmission line is active and the current consumption is higher than a threshold value.

In some embodiments, the method further comprises reserving a plurality of logic bits for a direct current (DC) balance line code processing operation.

In some embodiments, the method further comprises forming a data packet including the three symbols arranged to form a five bit word in two periods of a fixed data pulse frequency; and encoding by each symbol information of the five bit word in two periods so that the data packet includes at least fifteen bits.

In some embodiments, the method further comprises monitoring, by a micro controller unit, a plurality of battery cells controlled by the first or second battery cell controller, including managing the serial data stream including generating and outputting commands to the first or second battery cell controller to control transitions between the signal levels and the discarding of the any combinations of the maximum number of possible combinations of the at least three discrete signal levels; and converting, by a driver circuit between the micro controller unit and the transmission line a serial peripheral interface output from the micro controller unit to pulse bit data for output to the transmission line.

A battery management system comprises a first and second battery cell controllers and a transmission line providing a point-to-point signal transmission path between the first and second battery cell controllers. At least one of the first and second battery cell controllers includes a logic circuit constructed and arranged for encoding data for transmission as a serial data stream along the signal transmission path in compliance with a multi-level encoding technique. The logic circuit comprises an encoding/decoding circuit that generates a modulated signal of the serial data stream over at least three discrete signal levels at a predetermined and fixed data pulse frequency for transmission through the transmission line and encodes a plurality of data units of the serial data stream into a data packet. The data packet includes at least three symbols constructed and arranged with at least four consecutive transmissions per symbol. Each transmission of each symbol assumes one of the three discrete signal levels. At least one transceiver is configured in a transmit mode or a receive mode and that discards any combinations of the maximum number of possible combinations to reduce a source of electromagnetic interference (EMI) on the transmission line.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A battery management system, comprising:
a first battery cell controller;
a second battery cell controller, the first battery cell controller and the second battery cell controller each configured to monitor a plurality of battery cells; and
a transmission line configured to provide a point-to-point signal transmission path between the first battery cell controller and the second battery cell controller, wherein at least one of the first battery cell controller or the second battery cell controller includes
a logic circuit constructed and arranged for encoding data for transmission as a serial data stream along the signal transmission path in compliance with a multi-level encoding technique, the logic circuit comprising:
an encoding/decoding circuit configured to generate a modulated signal of the serial data stream over at least three discrete signal levels at a predetermined and fixed data pulse frequency for transmission through the transmission line and to encode a plurality of at least three data units of the serial data stream into a data packet, the data packet including at least three symbols corresponding to the at least three data units, wherein the at least three symbols are constructed and arranged with at least four consecutive transmissions per symbol, each transmission of each of the at least three symbols assuming one of the at least three discrete signal levels;
at least one transceiver configured in a transmit mode or a receive mode; and
a memory configured to store a data encoding table that maps a set of possible combinations of the at least three discrete signal levels to the encoded data bits, wherein the at least one transceiver is configured to discard combinations of the maximum number of possible combinations of the at least three discrete signal levels not stored in the data encoding table in order to reduce a source of electromagnetic interference (EMI) on the transmission line.

2. The battery management system of claim 1, further comprising:
a micro controller unit configured to output the data to the logic circuit and to manage the serial data stream, wherein the micro controller unit is configured to manage the serial data stream by generating and outputting commands to the first or second battery cell controller to control transitions between the at least three discrete signal levels and the discarding of the any combinations of the maximum number of possible combinations of the at least three discrete signal levels; and
a driver circuit between the micro controller unit and the transmission line configured to convert a serial peripheral interface output from the micro controller unit to pulse bit data for output to the transmission line.

3. The battery management system of claim 2, wherein the driver circuit comprises:
a first-in first-out (FIFO) memory configured to read a predetermined number of sequential bits of the serial data stream received from the micro controller unit and to translate the predetermined number of sequential bits to a multi-bit word;
an encoder/decoder circuit configured to translate the multi-bit word into a multi-level pulse encoded symbol comprising the at least four consecutive transmissions; and
a transceiver comprising an analog interface, wherein the encoder/decoder circuit is further configured to output a binary level corresponding to the symbol transmissions on the analog interface, and wherein the analog interface of the transceiver is configured to convert high and low logic inputs of the analog interface to a differential voltage such that a resulting generated current is output to the transmission line according to the at least three discrete signal levels.

4. The battery management system of claim 3, wherein the differential voltage is a positive differential voltage, negative differential voltage, or a null voltage on a plurality of analog outputs of the analog interface of the transceiver, and wherein the differential voltage is provided by activating or disactivating at least one of a pull-up or pull-down electrical circuit on each analog output.

5. The battery management system of claim 1, wherein the transmission line is a galvanically isolated transmission line that includes a capacitive isolation circuit.

6. The battery management system of claim 1, wherein the logic circuit is configured to reserve a subset of a plurality of logic bits for a direct current (DC) balance line code processing operation.

7. The battery management system of claim 1, wherein the at least three discrete signal levels are designated −1, 0, and +1, and wherein the at least one transceiver is configured to discard combinations of the maximum number of possible combinations including combinations with the same levels on the four consecutive transmissions and combinations that do not include at least a 0 value signal level in the four consecutive transmissions.

8. The battery management system of claim 1, wherein the data stream includes a plurality of data units that are encoded into the at least three symbols, and each symbol encodes information of a five bit word in two periods such that the data packet includes at least fifteen bits.

9. The battery management system of claim 1, wherein at least one of the first battery cell controller or the second battery cell controller is configured to monitor the plurality of battery cells including performing one or more of synchronous battery voltage/current measurement, coulomb counting, cell temperature measurement and integrated cell balancing, validation of the measurement integrity, sensing the physical quantities of a lithium-ion battery, and monitoring battery functions to validate the integrity of cell measurements.

10. A semiconductor device for encoding data bits onto a transmission line capable of reducing or eliminating undesired emission of radio frequency energy, comprising:
a bidirectional transceiver; and
a logic circuit constructed and arranged to encode data for output from the bidirectional transceiver as a serial data stream along the signal transmission path that is modulated over at least three discrete signal levels at a predetermined and fixed data pulse frequency, the logic circuit further configured to encode a plurality of at least three data units of the serial data stream into a data packet, the data packet including at least three symbols corresponding to the at least three data units, wherein the at least three symbols are constructed and arranged with at least four consecutive transmissions per symbol, each transmission assuming one of the three discrete signal levels; wherein the at least three symbols are encoded into a subset of a maximum number of possible combinations of the at least three discrete signal levels and stored in a data encoding table, and wherein the bidirectional transceiver is configured to discard combinations of the maximum number of possible combinations of the at least three discrete signal levels not stored in the data encoding table in order to reduce the undesired emission of radio frequency energy with respect to the symbols when output to the transmission line.

11. A method for encoding data bits onto a transmission line between a first battery cell controller and a second battery cell controller, comprising:
configuring a circuit for three discrete signal levels;
generating a plurality of data nibbles from the three discrete signal levels;
encoding the data nibbles into three symbols, each symbol formed of four consecutive chips, each chip assuming one of the three discrete signal levels;
encoding each symbol on two periods of a fixed data pulse frequency; and
discarding any of a maximum number of possible combinations of the at least three discrete signal levels that reduce or eliminate a source of electromagnetic interference (EMI) on the transmission line.

12. The method of claim 11, wherein discarding any of a maximum number of possible combinations of the at least three discrete signal levels comprises one or more of: discarding combinations having signal levels that impose a current consumption when a transmit driver coupled to the transmission line is active and the current consumption is higher than a threshold value.

13. The method of claim 11, further comprising reserving a plurality of logic bits for a direct current (DC) balance line code processing operation.

14. The method of claim 11, further comprising:
forming a data packet including the three symbols arranged to form a five bit word in two periods of a fixed data pulse frequency; and
encoding by each symbol information of the five bit word in two periods so that the data packet includes at least fifteen bits.

15. The method of claim 11, further comprising:
monitoring, by a micro controller unit, a plurality of battery cells controlled by the first or second battery cell controller, including managing the serial data stream including generating and outputting commands to the first or second battery cell controller to control transitions between the signal levels and the discarding of the any combinations of the maximum number of possible combinations of the at least three discrete signal levels; and
converting, by a driver circuit between the micro controller unit and the transmission line a serial peripheral interface output from the micro controller unit to pulse bit data for output to the transmission line.

16. The semiconductor device of claim 10, wherein the logic circuit is configured to encode logic bits that correspond to transitions between voltage levels of the at least three discrete signal levels.

17. The semiconductor device of claim 10, wherein each of the at least three symbols is transmitted via four consecutive transmissions and each symbol encodes information of a five bit word in two periods of the fixed data pulse frequency.

18. The semiconductor device of claim 16, wherein the logic circuit is configured to reserve a subset of a plurality of logic bits for a direct current (DC) balance line code processing operation.

* * * * *